United States Patent [19]

Crosby

[11] Patent Number: 4,733,174

[45] Date of Patent: Mar. 22, 1988

[54] CIRCUIT TESTING METHOD AND APPARATUS

[75] Inventor: Philip S. Crosby, Portland, Oreg.

[73] Assignee: Textronix, Inc., Beaverton, Oreg.

[21] Appl. No.: 837,990

[22] Filed: Mar. 10, 1986

[51] Int. Cl.$^4$ ............................................. G01R 31/02
[52] U.S. Cl. ............................... 324/158 R; 324/71.3; 324/73 R; 250/492.2
[58] Field of Search ............ 324/73 PC, 73 R, 158 R, 324/158 D, 71.3; 250/310, 311, 398, 492.2

[56] References Cited

U.S. PATENT DOCUMENTS

| | | | |
|---|---|---|---|
| Re. 28,773 | 4/1976 | Gibson, Jr. ........................... | 315/12.1 |
| 3,882,471 | 5/1975 | Walker et al. ....................... | 365/118 |
| 4,139,800 | 2/1979 | Ostermeier et al. ............. | 315/13.11 |
| 4,232,250 | 11/1980 | Richards ............................. | 328/123 |
| 4,417,203 | 11/1983 | Pfeiffer et al. ..................... | 324/71.3 |
| 4,490,643 | 12/1984 | Silver .................................. | 313/391 |
| 4,573,008 | 2/1986 | Lischke ............................. | 324/158 R |

FOREIGN PATENT DOCUMENTS

| | | | |
|---|---|---|---|
| 0066070 | 12/1982 | European Pat. Off. ........ | 324/158 R |
| 0134846 | 8/1984 | Japan ................................ | 250/492.2 |

OTHER PUBLICATIONS

"Tri-Potential Method for Testing Electrical Opens and Shorts in Multi-Layer Ceramic Packaging Modules", by Chang et al, IBM Tech. Disc. Bull., vol. 24, #11A, pp. 5388-5390, 4/82.

"Improvement of Voltage Contrast in the Scanning Electron Probe by Floating the Ground Potential of the Device", by Furakawa et al. J. Voc. Sci Technol. 12/78, pp. 1853-1855.

*Primary Examiner*—Reinhard J. Eisenzopf
*Assistant Examiner*—W. Burns
*Attorney, Agent, or Firm*—John P. Dellett; Robert S. Hulse

[57] ABSTRACT

A testing method and apparatus employs electron beam writing and reading of conductive paths in a circuit device rather than physical probing of conductive elements. Portions of the circuit device, e.g., conductive paths, are bistably stored at a given potential and then the device is read by a reading beam to determine if proper connections exist. Read out is at comparatively high levels represented by the difference between bistable voltage values. Once a portion of the device has been tested, it may remain in stored condition such that additional cross checking or repetition of testing is rendered unnecessary.

17 Claims, 7 Drawing Figures

CIRCUIT TESTING METHOD AND APPARATUS

BACKGROUND OF THE INVENTION

The present invention relates to a circuit testing method and apparatus and particularly to such method and apparatus for providing electrical contact and measurement of circuit elements without the requirement of contacting those elements physically.

Present day electronic circuitry typically employs a multiplicity of subunits in the form of integrated circuits, circuit boards and hybrid units which are individually mass produced and which each contain their own complex conductive pattern. These circuit elements are separately tested for their operability and may require individual specialized test fixtures for making multiple connections with the device-under-test. Test fixtures represent an additional expense in regard to design, operation and maintenance.

Recent efforts have been directed to testing individual circuit devices without forming an actual physical contact therewith. Instead, an electron beam is used to contact or scan conductive portions of the circuit device. See, for example, U.S. Pat. Nos. 4,415,851 to Langner et al and 4,417,203 to Pfeiffer et al as well as IBM Technical Disclosure Bulletin, Vol. 24, No. 11A, April, 1982 entitled "Tri-Potential Method for Testing Electrical Opens and Shorts in Multi-Layer Ceramic Packaging Modules" by Chang et al. Testing procedures as hereinbefore described involve electron beam reading and writing operations taking place within the stable portion of the secondary emission characteristic for the material being scanned. A given contact point is charged to a given value and other contact points, which are supposed to be connected thereto, are read out to see if they are at the same potential level. If they are not, a proper connection is absent, while if contact is indicated to supposedly unconnected terminals, then an improper connection or short is indicated.

In the aforementioned prior art method, electron flood guns are utilized to bring all metal parts on a circuit device to a given voltage level, and then, with the flood guns turned off, a selected connection is brought to a different voltage level with a writing beam. Various other connections on the device are read, as indicated above, to determine their connection or lack of connection with the point which is written. Unfortunately, the measurement of extremely small voltages is required and therefore the voltages read are subject to error. Moreover, each writing and reading procedure requires the device terminals to be brought to an initial voltage level before a circuit point is written. In general, all other circuit points are then measured with respect to the written circuit point requiring a lengthy scanning and comparison procedure.

SUMMARY OF THE INVENTION

According to the present invention, in a particular embodiment thereof, circuit devices are tested without physical contact by means of an electron beam which alters the voltage level of the circuit point, upon which the electron beam impinges, from a first of two bistable voltage levels to a second of the two bistable voltage levels, wherein the second level is on the opposite side of the "first crossover" in the secondary emission characteristic for the material in question from the first voltage level. Operation is the unstable or bistable region of the material's secondary emission characteristic whereby a substantial voltage difference exists between written and non-written circuit points, rendering the proper identification thereof more certain. In order to acquire the bistable storage mode, a relatively low voltage flood beam of electrons is employed to initially establish the potential of a surface of the circuit device at a first of the two bistable potential levels, enabling the same circuit point then to be written to the other bistable level.

Not only are "written" connections easily distinguishable from non-written connections because of an appreciable voltage difference, but also the written areas are bistably "stored" and can remain so if desired, through continued application of flood beam electrons, so that tested and non-tested connections are easily distinguishable. Thus, each separate test of a connection or group of connections can be more restricted so far as the extent of the circuit that need be read out, and a whole circuit board or substrate does not require complete scanning for each test. As a consequence, the testing time for the circuit element is materially shortened.

It is accordingly an object of the present invention to provide an improved circuit testing method and apparatus which does not require physical connection with the element being tested.

It is another object of the present invention to provide an improved circuit testing method and apparatus for establishing a substantial difference in stored and non-stored areas of a circuit element so that the difference therebetween can be easily read out.

It is a further object of the present invention to provide an improved method and apparatus for testing a circuit device for determining the integrity of connections without requiring an exhaustive determination of the circuit paths for each test.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
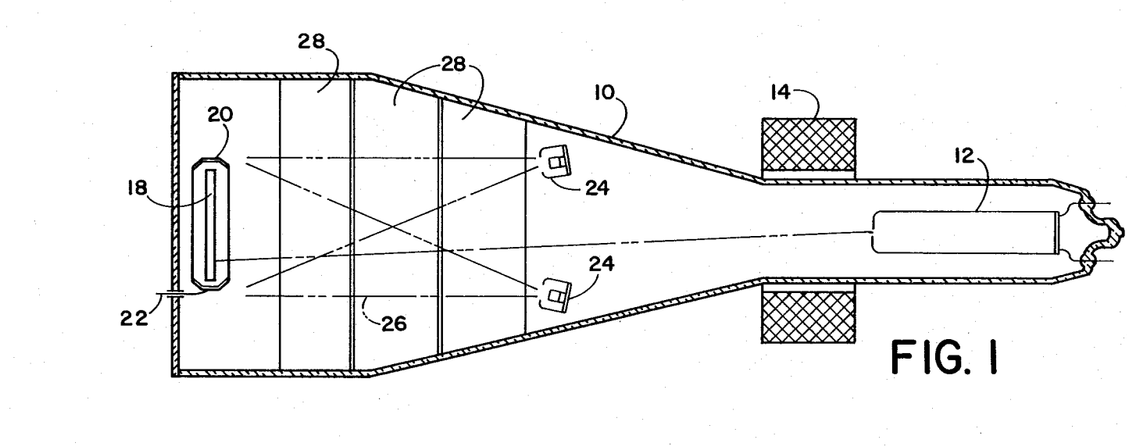
FIG. 1 is a schematic representation of a cross-section of electron beam reading and writing apparatus according to the present invention.

Referring to the drawings and particularly to FIG. 1, a reading and writing apparatus as employed in the present invention is similar in principle to a direct viewing bistable storage tube of the type utilized for continuously presenting a viewable representation of a waveform or the like for some time after the actual occurrence of the event. In accordance with the present invention, rather than wfiting information to a viewable cathode ray tube screen, information is bistably "written" to elements of a circuit device, such as a hybrid circuit, integrated circuit or circuit board. Then, a reading electron beam determines the previous areas written to, as well as those areas with which the written areas have a physical, electrical connection. As will hereinafter be more fully explained, the written and non-written areas are easily distinguished, and since the written areas are bistably stored, any portion of the device under test can be maintained at a given potential for an extended period so as to be continuously distinguishable from non-written areas without requiring re-examination of the entire device-under-test each time the continuity of a given circuit is to be investigated.

Referring to FIG. 1, the electron beam reading and writing apparatus, depicted in schematic form, includes an evacuated, funnel shaped chamber 10 housing an electron gun within its narrow neck around which is disposed deflection yoke 14 adapted to direct the position of electron writing and reading beam 16. At the larger end of the enclosure, opposite the electron gun, is positioned a device-under-test, 18, which may comprise a hybrid circuit, circuit board, or integrated circuit having conductive elements generally oriented toward electron gun 12, these conductive elements being generally separated by and mounted on an insulating substrate. The device-under-test 18 forms the "target" of the apparatus and is peripherally surrounded by a target electrode 20 which is open in a direction axial of the structure, i.e., in the direction of electron gun 12 whereby beam 16 can be directed by yoke 14 over the adjacent surface of the device-under-test. The target electrode is provided with a lead 22 by means of which appropriate voltages may be applied to the target and from which read-out signals may be obtained.

The FIG. 1 device is further provided with flood guns 24 adapted to produce electron flood beams 26 directed toward the device-under-test 18. The flood guns are typically maintained at a comparatively low voltage with respect to target electrode 20, e.g., −200 to −300 volts, while structure of electron gun 12 is at a much higher voltage, e.g., −2 kv to −3 kv with respect to the target electrode. The enclosure 10 of FIG. 1 is further supplied with wall band electrodes 28 around the interior of the enclosure between the flood guns and the target for the purpose of collimating the flood electrons in a manner understood by those skilled in the art. The wall band electrodes are connected to a voltage source or sources appropriate to this purpose.

Figure 2:
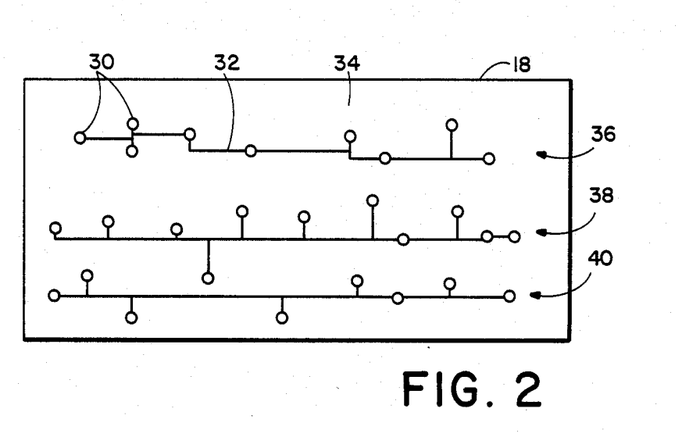
FIG. 2 is a plan view, also in schematic form, of a circuit element or device to be tested.

FIG. 2 is schematically illustrative of a circuit device-under-test, for example a hybrid circuit having a generally insulating forward substrate surface 34 carrying conductive pads 30 adapted to make connection between the hybrid circuit and other apparatus with which it is intended to function. These pads 30 are typically interconnected within the circuit device by means of internal conductive paths 32 to form a common node, i.e., a common connection between a plurality of pads 30. In the device as illustrated in FIG. 2, three nodes 36, 38 and 40 are present. It will be appreciated that the usual device-under-test may have a much larger number of nodes.

The purpose for the present invention, as hereinafter more fully described, is to test the continuity, i.e., the integrity of interconnection between pads of a single node, while also detecting shorts between nodes. Utilizing the apparatus of FIG. 1, a pad of a selected node is "written" by electron beam 16 and bistably stored in a given written condition by means of flood beams 26. The written condition is then read out, employing beam 16 as a reading beam.

In order to more fully understand the mechanism by which the FIG. 1 apparatus operates, it is desirable to consider the phenomenon of secondary emission from a target, such as device-under-test 18, when bombarded by an electron beam such as beam 16. When a beam hits the target, secondary emission of electrons can occur as a result of the landing energy of electrons from the beam. Secondary electrons are "knocked out" of the target surface and are collected by a nearby electrode element, i.e., target electrode 20 which is normally maintained at a positive voltage. When the electron beam lands with very little energy, it will knock out few, if any, secondary electrons. As the landing energy is increased, secondary emission will increase until, beyond a certain limit, the landing electrons hit the surface with such force and penetrate the material so deeply that more and more of the secondary electrons produced by the impact are trapped within the material instead of escaping.

Figure 3:
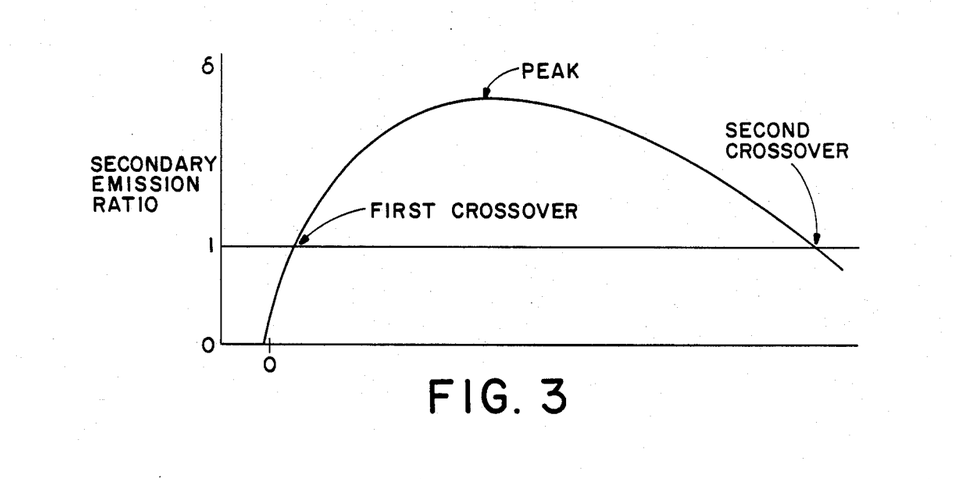
FIG. 3 is a plot of secondary emission ratio versus electron beam energy for a given material included in a circuit device to be tested.

If the landing speed is varied and the amount of secondary emission is plotted, a curve with the general appearance of FIG. 3 results. Secondary emission is shown in terms of the secondary emission ratio, i.e., the ratio of secondary emission to the primary or incident beam. The line on the graph representing the secondary emission ratio of one is of considerable significance. Portions of the curve above this line represent conditions under which the target loses more electrons by way of secondary emission than it gains, and conversely at points below this line, the target gains more electrons from the primary beam than it loses.

Figure 4:
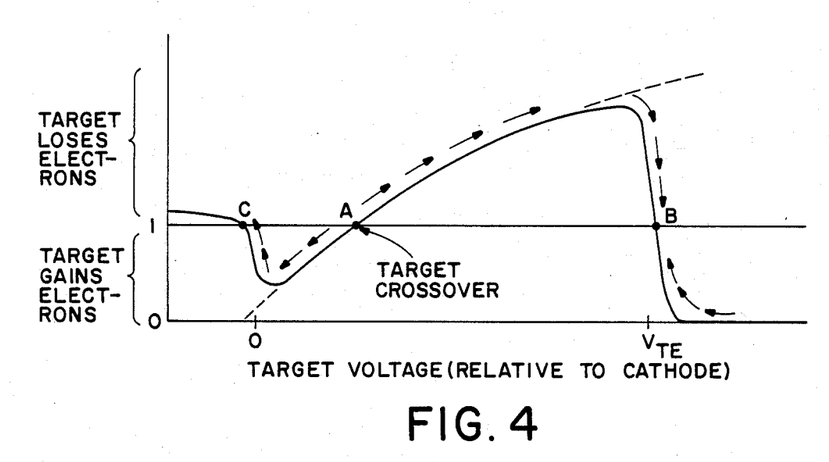
FIG. 4 is a plot of secondary emission yield versus target voltage for an electron beam reading and writing apparatus such as depicted in FIG. 1.

The curve of FIG. 3 is a general and theoretical curve for initial understanding of the phenomenon, but the curve of FIG. 4 is more descriptive of the operation of specific apparatus. For an apparatus, such as the one depicted in FIG. 1, secondary emission yield is plotted against target voltage, here relative to zero voltage of the flood gun cathodes. The target electrode voltage is indicated as $V_{TE}$ and it will be appreciated that if, for any reason, a point on the target does exceed $V_{TE}$, the liberated electrons will tend to return to the target at the most positive element in the neighborhood. The curve therefore drops to a secondary emission yield of zero at point B on the curve rather than continuing on as indicated on the dashed portion of the curve.

Moreover, once the target voltage is below that of the cathode, a stream of electrons will not land on it anymore but will go straight to the target electrode. Therefore, the curve intersects the unity secondary emission line at point C. Points B and C are known as upper and lower stable points on the high voltage side and the low voltage side of "first crossover" point A in the secondary emission characteristic for the target material of interest.

The target cannot rest at point A since the unexpected gain or loss of a single electron due to noise will bring it under the influence of divergent trends. A net loss of electrons, and a drift in a positive direction, occurs whenever the target voltage is in the region where the curve is above an SER (secondary emission ratio) of one, and a net gain and a negative drift occurs in regions where the SER is below one. This is shown by the arrows in FIG. 4. Whenever the curve approaches SER =1, the movement will slow down, whereas in regions indicating large gains or losses the voltage will change more quickly. This difference is indicated by the different thickness of the arrows in FIG. 4.

A drift towards stable states occurring in any part of the target is enhanced as a supply of electrons is directed towards it. When the whole target is flooded with a defocused electron beam or beams, i.e., beams 26 in FIG. 1, all portions of the target whose surface voltage happens to be above first crossover point A will move towards the upper stable point B, and all portions set below point A will move towards the lower stable point C. Under the influence of the flood beams, the target will be maintained at these points, so far as these points are insulated from One another. Generally speaking, the substrate, e.g., in a hybrid circuit device, will be insulating and portions thereof can be set and maintained at different voltage levels if desired. Similarly, the conducting pads can be set and stored at desired levels, but the pads forming a conductive node will necessarily reside at the same voltage level. The voltage $V_{TE}$ is preferably on the order of two or three hundred volts for bistable storage.

Figure 5:
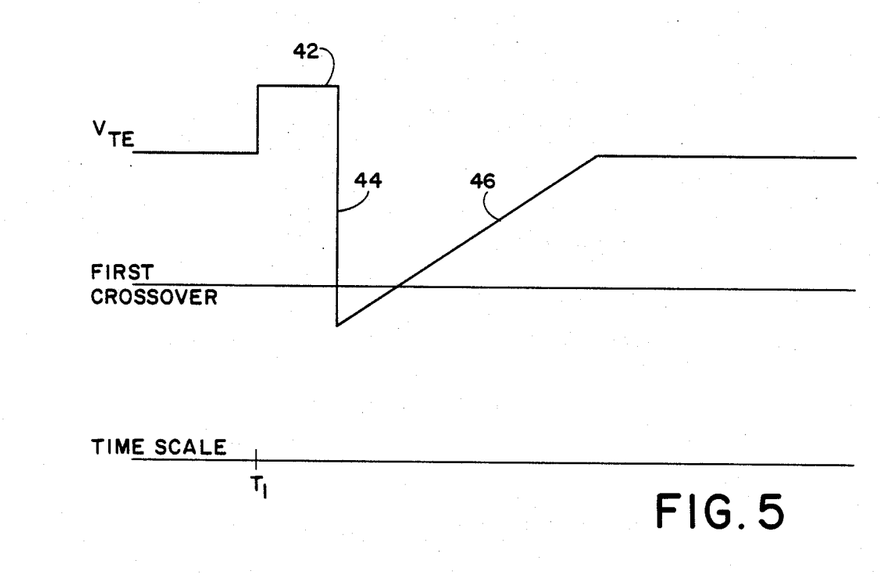
FIG. 5 depicts a "preparation" or "erase" pulse as employed with the apparatus of FIG. 1.

Before "writing" various conductive and nonconductive portions of the target an "erase" or "preparation" waveform is applied to the target electrode. This waveform is depicted in FIG. 5 and will be familiar to those skilled in the art of direct view bistable storage tubes. The target electrode normally resides at a given potential $V_{TE}$, as hereinbefore mentioned, and acts as a collector of secondary electrons from the target. At a given time $t_1$ an erase pulse may be applied to the target electrode consisting of a first positive-going portion 42, followed by a negative excursion 44 and a positive going ramp 46. As a result of capacitive coupling between the target electrode and the target, all portions of the target will be raised above the first crossover by the positive-going portion 42 of the waveform, causing the entire target surface to be "written positive" or raised to the level of bistable point B in FIG. 4. The negative-going excursion 44 then typically "erases" the entire target, returning all portions of the target to bistable point C in FIG. 4 as the voltage of the target is driven below first crossover point A. Then, the target electrode voltage is returned to $V_{TE}$ along positive-going ramp 46 to avoid writing the entire target surface positive again with a steep-front positive-going waveform. As a result of this operation, all portions of the target will be uniformly returned to flood gun cathode potential in preparation for bistable storage operation.

In the alternative, the entire waveform of FIG. 5 may be raised above the first crossover line such that the entire target surface remains in a written positive condition or faded positive condition wherein the voltage at every point on the target surface resides near the target electrode voltage $V_{TE}$. In either case, substantially the same shaped waveform may be employed, and whether the waveform used intersects the first crossover line or resides entirely above the first crossover line is dependent upon the mode of operation desired as hereinafter more fully disclosed. The preparation of the target is in any case a necessary part of the bistable storage procedure to establish an initial bistable level. The "peak-to-peak" magnitude of the erase or preparation waveform as depicted in FIG. 5 is in general comparable in voltage difference to the difference between the potential of the flood gun cathode and the usual potential of the target electrode, i.e. $V_{TE}$. It is necessary that the combination of flood gun potential $V_{TE}$ and preparation pulse enable bistable storage, wherein some part of the target will initially reside at or will be written (with a writing beam), and stored via the flood beam, below the peak in the secondary emission yield curve and below the first crossover, while other parts can reside at or be written thereabove.

The system according to the present invention is further depicted in FIG. 6 and comprises an electron beam reading and writing apparatus 50 of the type described in connection with FIG. 1. The testing of a circuit device 18 is preferably under the control of a microprocessor 52 coupled to computer memory 54 via bus 56, the bus 56 also providing control information to deflection circuits 58 operating deflection yoke 14, target electrode voltage control 60, and electron gun beam control 62. Bus 56 also receives input from comparison circuit 64 driven from demodulator 66. The target electrode 20 is connected to voltage control 60 via current transformer 68 the secondary of which is connected to demodulator 66. The processor is programmed to cycle through a predetermined procedure for testing the integrity of circuits on the device-under-test 18 which is disposed within the evacuated chamber of apparatus 50 as a target. The memory 54 contains a schedule or list of connections which the device-under-test is supposed to include, and the comparison is made between the connections that are supposed to exist and the connections that actually do exist for determining whether the device-under-test passes.

According to a preferred mode of operation and as hereinafter more fully described, the processor 52 first directs the entire target (the device-under-test) to be written positive or faded positive by directing voltage control 60 to apply a preparation pulse or waveform of the type depicted in FIG. 5 to target electrode 20. In the preferred embodiment, the entire waveform is above the first crossover voltage level rather than intersecting the same such that the entire target surface is written positive. The reason for this, as will hereinafter more fully appear, is that the SER (secondary emission ratio) of the pads on a device to be tested are in a typical case formed of tungsten having an SER of less than one for the "writing" beam 16. After the entire target surface is faded positive, the processor directs deflection circuits 58 to aim electron beam 16 at a particular pad of a particular node, and directs beam control 62 to provide a writing potential beam, e.g., having a potential of −2 to −3 kv. The flood guns 24 are turned off when the writing beam is turned on. Assuming the pad being written is formed of tungsten in this example, the "writing" beam will bring the particular pad at which the beam is directed to a point below the first crossover A in FIG. 4. As a consequence, the pads being written will be driven towards the lower bistable point C in FIG. 4 and will be bistably stored in this state when the flood beams 26 from flood guns 24 are turned back on. The flood guns are turned back on after sufficient time has elapsed for the writing beam to lower the potential of the written point below first crossover A.

It will be noted that the insulating portion of the substrate generally has a much higher SER than the conductive pads, and even if "written" by the "writing"

beam, would be driven toward the higher bistable point B. As hereinbefore mentioned, all other pads forming a part of the same node 32 in FIG. 2 will necessarily reside at the lower bistable potential of the written pad and can be read out to determine if the proper node connection is present.

Assuming only one node is thus written, and it is now desirable to provide read out information, the processor 52 directs deflection circuits 58 to point the beam in turn to each of the pads belonging to the node under test while beam control 62 is directed to decrease the current of beam 16 so that the current (and reading time) will be too low to "write" information on the target. The beam is also modulated, e.g., at about a 500 kHz rate, and a resulting readout current change is derived from target electrode 20 via current transformer 68. As the beam 16 "reads" the target, the number of secondary electrons that are emitted is a function of the stored potential of the portion of the target struck, and of the type of material that it happens to be. If the target element being struck is at the faded positive potential, then few secondary electrons are collected by target electrode 20. On the other hand, if the portion of the target being struck by the readout beam is at a low or flood gun potential, then a large number of secondary electrons will be emitted and will cause an increase in target electrode current detected by current transformer 68. Demodulator 66, which is operated synchronously with the 500 kHz rate, provides an output signal for comparison in circuit 64 where information relative to a given node connection will be compared with information accessed from memory 54. Thus, if a pad connected to the written pad is being read by the reading beam, a relatively large current will flow in the primary of current transformer 68, indicating to comparison circuit 64 that a conductive area is present which should jibe with the information as to the circuit configuration in memory 54. The presence of the correct comparison is in turn stored in memory 54 by processor 52. If the proper pads for the entire node do not present an output as a written area, then apparently an open circuit exists, and the part will be rejected. When an entire node has been checked, e.g., for example node 36 in FIG. 2, this node may remain in stored or written condition.

The processor 52 now directs the deflection circuits 58 to point the beam in turn to each of the pads belonging to a next node under test, e.g. node 38, while beam control 62 is again directed to control beam 16 so that it will not "write" information on the target. The pads of this node are "read" to insure that they all remain in the faded positive state. This allows for the determination of electrical leakage or shorts with respect to the previously tested node (or nodes). Thus, if one of the pads of node 38 to which the reading beam is directed causes a large read out current, then such pad must be shorted to another node, and the part will be rejected.

Node 38 is then tested in the same manner as described above for node 36 to determine if node 38 has continuity. That is, one pad of node 38 is "written", and the rest of the pads of the node are "read out" to make sure they provide an output indicative of a written area. The cycle is continued until all the nodes are tested. It will be seen that each pad, except for those belonging to the first tested node, will have been tested twice.

It will be seen that once each node is tested in the foregoing manner, it suitably remains bistably stored, considerably reducing the time required for checking subsequent nodes and connections in the same circuit device since the entire circuit device does not have to be scanned for each node checked. Moreover, as hereinbefore mentioned, the stored voltage on a pad or node and the nonstored value on another pad or node differ widely in voltage value, i.e., between points B and C in FIG. 4 (100 volts or more) and are easily read on the readout cycle.

Although the initial preparation of the target by fading the target positive has been described, followed by "writing" various nodes to the lower or flood gun cathode bistable potential, it will be appreciated the reverse can be accomplished, especially if portions of the circuit device are being tested which have a comparatively high SER relative to the writing beam. Thus, the preparation pulse of FIG. 5 may first be utilized as shown, wherein portions of the waveform 44 and 46 intersect the first crossover line, whereby the entire target is brought down to the flood gun cathode potential and left there despite return of the target electrode to the higher potential. Then the nodes or points of interest are "written" by turning off the flood gun, and directing the "writing" beam thereat to bring the same to the higher bistable potential point (B in FIG. 4). The flood beams are then turned back on and the target surface can be read to ascertain those portions that are "written" in comparison to those portions not written. This time, a higher current will flow in conductor 22 when the reading beam is directed toward a non-written portion of the target than when a written portion is read.

As an initial part of the test, employing either mode of operation, it may be desirable first to read out all portions of the target, after presentation of the preparation pulse, to make sure that the entire target resides at the same initial potential.

As another preparation step, in order to assure proper registration of the device under test relative to the scanning electron beam so that a proper comparison can be made with stored data, the entire procedure may be preceded by an "imaging" operation. The SER of the insulating or substrate portion of the hybrid circuit or the like is typically much greater than the SER of metal portions. Therefore, when the entire surface is first returned to flood gun potential (with an erase pulse), a weak image of the surface can be read out by raster scanning the surface with a "reading" beam that is again too low in current to change the state of any portion of the target. The information read out, (with the reading beam being pulsed) will indicate the general configuration of the pads on the substrate for a general comparison with the configuration stored in memory. As a result, the position of the test fixture can be allowed for, in comparison with stored computer data.

Figure 7:
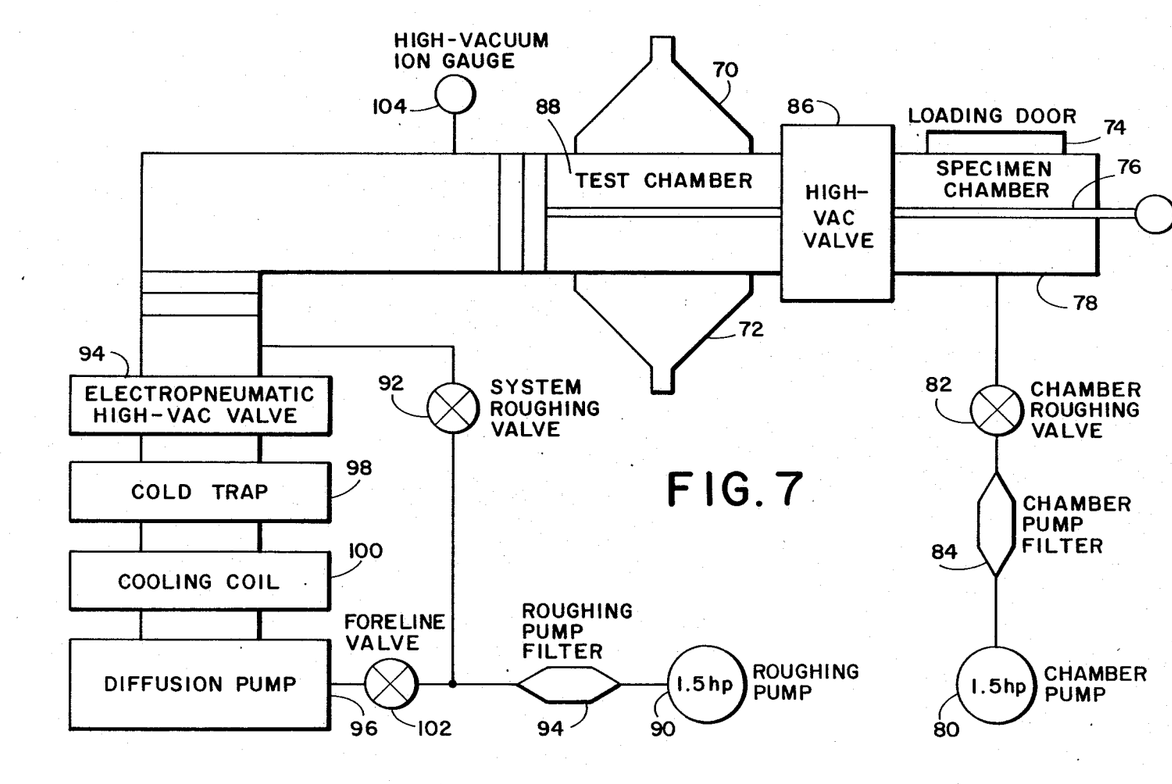
FIG. 7 is a diagram of an overall testing system according to the present invention.

It will be appreciated that the representation of the electron beam reading and writing apparatus of FIG. 1 is somewhat schematic, and in fact it is necessary to provide a system for inserting a device under test into a high vacuum chamber, testing the device, and removing the same from the high vacuum chamber. Furthermore, it may be desirable to test nodes having pads located on opposite parallel sides of the same substrate. Referring to FIG. 7, an overall system is depicted in schematic form including a first reading and writing apparatus 70 for the upper side of a circuit device, and a lower reading and writing device 72 for a lower side of the same circuit device. Clearly, the connections on opposite sides of a circuit device can be tested separately or together. In the illustrated system, the device-under-test, or several such devices, are inserted through loading door 74 onto a transport mechanism 76 in a specimen chamber 78. A preliminary vacuum is provided by chamber pump 80 which draws a vacuum through chamber roughing valve 82 and filter 84. After a preliminary vacuum is achieved, high vacuum gate valve 86 is opened and the transport mechanism moves the device-under-test into test chamber 88 where it is disposed between the reading and writing apparatus 70 and 72. The transport mechanism 76 itself includes a target electrode and a cassette carrier for the device or devices-under-test. The test chamber is initially brought down to a vacuum of about $10^{-3}$ torr utilizing roughing pump 90 which draws a vacuum through system roughing valve 92 and filter 94. Then the roughing system valve 92 is closed and electropneumatic high vacuum valve 94 is opened providing access to diffusion pump 96 via cold trap 98. As will be understood by those skilled in the art, the cold trap causes remaining gaseous atmosphere molecules to lose kinetic energy and "fall" into the diffusion pump where the gas molecules become entrapped by oil vapor that condenses on walls of the device as a consequence of operation of cooling coil 100. Foreline valve 102 allows evacuation of gas from the diffusion pump through filter 94 and roughing pump 90. Ion gauge 104 may be used to ascertain the proper vacuum for electron beam operation.

Figure 6:
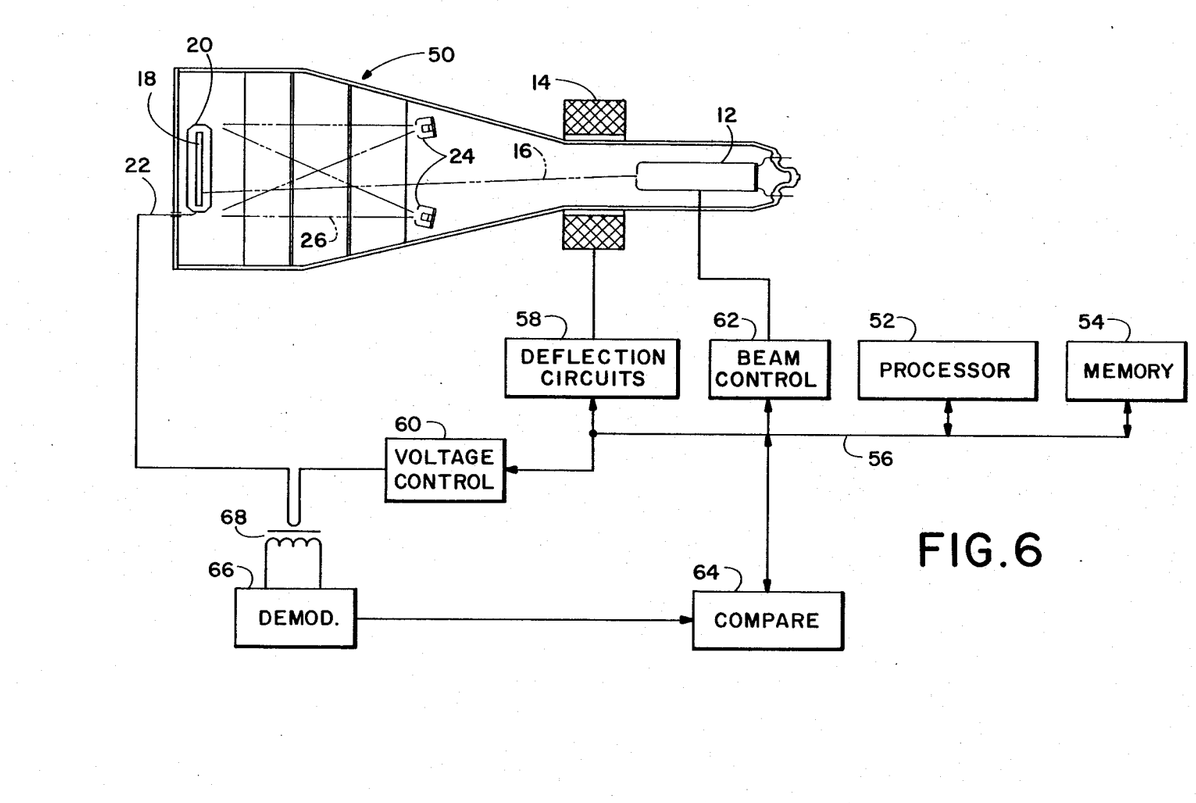
FIG. 6 is a block diagram of apparatus employed according to the present invention.

With the method and apparatus as depicted in FIGS. 1, 6 and 7, circuit devices such as hybrid circuits, circuit boards and integrated circuit devices can be rapidly and easily tested for circuit integrity. portions of the circuit device under test are bistably stored at a voltage level appreciably different from the background or substrate level and can be easily and rapidly read out to determine the circuit integrity. Moreover, since values can be stored virtually indefinitely, and independently of further testing operations, repeated tests for shorts or connections are unnecessary, eliminating an all-permutations-and-all-combinations approach. In practice, the testing period is reduced to a fraction of the time heretofore employed for non-contact testing of these devices. Of course, the non-contacting testing procedure eliminates the necessity for specialized fixtures and probes for the test of each type of circuit device, and only a memory listing of the proper design connections is required.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. The method of testing a circuit device characterized by conductive circuit paths including a first circuit path, said method comprising:
    positioning said circuit device in a substantially evacuated chamber,
    directing a flood beam of electrons toward said circuit device for establishing a surface of said circuit device at a first stable potential, and
    directing a writing beam of electrons toward a selected portion of a first circuit path of said circuit device for changing the potential of said portion such that said flood beam of electrons maintains said portion at a second stable potential,
    wherein said second stable potential is on the opposite side of the first crossover in the secondary emission characteristic for said portion from said first stable potential.

2. The method according to claim 1 further including reading other portions of said circuit device by means of a reading beam of electrons to ascertain the potential of said other portions to determine whether said other portions are conductively connected to the first mentioned portion of said circuit device by said first circuit path.

3. The method according to claim 2 further including testing separate circuit paths by repeating the foregoing procedure for said separate circuit paths while maintaining already tested circuit paths at said second stable potential.

4. The method according to claim 2 including storing an intended schedule of connections for said first circuit path and comparing the said reading of said other portions of said circuit device with said schedule to determine whether said circuit path is continuous and to determine whether unintended connections exist.

5. The method according to claim 1 including disabling said flood beam of electrons while said writing beam initially changes the potential of said portion, and then re-enabling said flood beam of electrons.

6. The method according to claim 1 including capacitively coupling a preparation potential to said circuit device prior to directing said writing beam of electrons toward said selected portion wherein said preparation potential is commensurate with said first stable potential level.

7. The method according to claim 6 wherein said preparation potential is above said first crossover in said secondary emission characteristic and wherein said selected portion is written and stored to said second stable potential level which is below said first crossover.

8. The method according to claim 6 wherein said preparation potential is below said first crossover in said secondary emission characteristic and wherein said selected portion is written and stored to said second stable potential level which is above said first crossover.

9. The method according to claim 1 further including reading other portions of said circuit device as are expected to be a part of said first circuit path by means of a reading beam of electrons to ascertain the potential of said other portions to determine whether said other portions are conductively connected to the first mentioned portion of said circuit device by said first circuit path,
    reading third portions of said circuit device as are expected to be part of a different circuit path of said circuit device by means of a reading beam of electrons to ascertain the potential of said third portions to determine whether said third portions are disconnected from said first circuit path,
    directing a writing beam of electrons toward one of said third portions of said different circuit path of said circuit device for changing the potential thereof such that said flood beam of electrons maintains said one of said third portions at a stable potential level on the opposite side of the first crossover in the secondary emission characteristic for said one of said third portions, and
    reading other third portions of said circuit device as are expected to be part of said different circuit path of said circuit device by means of a reading beam of electrons to ascertain the potential of said other third portions and determine whether said other third portions are conductively connected to the said one of said third portions of said circuit device by said different circuit path.

10. The method according to claim 9 further including reading another of said circuit paths and continuing with the above procedure for other circuit paths to test said circuit device.

11. An apparatus for testing a circuit device characterized by conductive paths, said apparatus comprising:
a chamber for receiving said circuit device,
a target electrode positioned proximate said circuit device as received within said chamber,
a first electron source for directing a higher energy beam of electrons toward said circuit device,
means for applying a preparation potential to said target electrode in the presence of flood electrons from said first electron source for bringing a surface of said circuit device to a first stable potential, and
means for directing said beam of electrons from said second electron source toward a selected portion of said circuit device comprising part of a given said circuit path for altering the potential of said portion so that said flood beam stores the potential of said portion at a second stable potential on the opposite side of the first crossover in the secondary emission characteristic for said portion from said first stable potential.

12. The apparatus according to claim 11 further including means for disabling said first source of flood electrons while electrons from said second electron source are at least initially directed toward said selected portion.

13. The apparatus according to claim 11 further including processor means for operating said means for applying said preparation potential and for then operating said means for directing said beam of electrons from said second source to store the potential of said selected portion at said second stable state, and
memory means operatively connected to said processor means for storing a list of connections intended for said given circuit path,
said processor being further operative to cause said beam of electrons from said second electron source to read said circuit device while comparing the potential of portions of said circuit device with said selected portion to determine the continuity of said given circuit path.

14. The apparatus according to claim 13 including connection means coupled to said target electrode for reading out the potential levels of portions scanned by said second electron source.

15. The apparatus according to claim 11 further including means for evacuating said chamber and means for transporting said circuit device into said chamber prior to evacuation.

16. The apparatus according to claim 11 further including additional first and second electron sources and additional directing means on the opposite side of said circuit device from said first mentioned first and second electron sources, and second directing means for testing a circuit path accessible from said opposite side of said circuit device.

17. An apparatus for testing a circuit device characterized by conductive paths, said apparatus comprising:
a chamber for receiving said circuit device,
a target electrode positioned proximate said circuit device as received within said chamber,
a first electron source for directing flood electrons toward said circuit device and means for applying voltage to said target electrode relative to said first electron source for enabling bistable potential storage at locations on said circuit device at first and second stable potentials on either side of the first crossover in the secondary emission characteristic for materials at said locations,
a second electron source for directing a higher energy beam of electrons toward said circuit device, and
means for directing said beam of electrons from said second electron source toward a selected portion of said circuit device comprising part of a given said circuit path for altering the potential of said portion from said first stable potential so that said flood beam stores the potential of said portion at said second stable potential.

* * * * *